US006828539B1

(12) United States Patent
Kuwabara (10) Patent No.: US 6,828,539 B1
(45) Date of Patent: Dec. 7, 2004

(54) DETECTION SIGNAL CORRECTION METHOD AND DEVICE AS WELL AS SOLID-STATE DETECTOR FOR USE THEREWITH

(75) Inventor: Takao Kuwabara, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/472,954

(22) Filed: Dec. 27, 1999

(30) Foreign Application Priority Data

Dec. 24, 1998 (JP) .......................... 10-366161

(51) Int. Cl.[7] .............................................. H01L 27/00
(52) U.S. Cl. .................................. 250/208.1; 250/214.1
(58) Field of Search ........................ 250/208.1, 214 R, 250/214.1, 214 C, 214 AG; 348/272, 294, 297, 220.1, 222.1, 221.1, 229.1

(56) References Cited

U.S. PATENT DOCUMENTS

| | | | | |
|---|---|---|---|---|
| 4,803,359 A | | 2/1989 | Hosoi et al. .............. | 250/327.2 |
| 5,038,225 A | * | 8/1991 | Maeshima .................. | 358/461 |
| 5,187,369 A | | 2/1993 | Kingsley et al. ....... | 250/370.11 |
| 5,289,286 A | * | 2/1994 | Nakamura et al. ........ | 348/223.1 |
| 5,455,622 A | * | 10/1995 | Compton .................. | 348/229.1 |

FOREIGN PATENT DOCUMENTS

| | | | | |
|---|---|---|---|---|
| JP | 59-211263 | 11/1984 | ........... | H01L/27/14 |
| JP | 1-216290 | 8/1989 | ............. | G01T/1/24 |
| JP | 7-72256 | 3/1995 | ............. | G01T/1/20 |
| JP | 10-232824 | 9/1998 | ........... | G06F/12/06 |
| WO | 92/06501 | 4/1992 | ........... | H01L/27/14 |

OTHER PUBLICATIONS

Antonuk, L.E. et al, "Signal, Noise, and Readout Considerations in the Development of Amorphous Silicon Photodiode Arrays for Radiotherapy and Diagnostic X–ray Imaging", SPIE vol. 1443, Medical Imaging V, Image Physics (1991), pp. 108–119.

Qureshi, S. et al, "Material Parameters in Thick Hydrogenated Amorphous Silicon Radiation Detectors", Lawrence Berkley Laboratory, University of California.

Naruse, Y., "Metal/Amorphous Silicon Multilayer Radiation Detectors", IEE Transactions on Nuclear Science, vol. 36, No. 2, Apr. 1989, pp. 1347–1352.

* cited by examiner

*Primary Examiner*—Que T. Le
(74) *Attorney, Agent, or Firm*—Sughrue Mion, PLLC (57) ABSTRACT

In the state where X-rays are not projected, image signals S1 are read out from a detector 1, and the values of these image signals S1 are stored as offset correction values in a correction table 16. The detector 1 is then irradiated with X-rays having a maximum dose of radiation to determine the gain correction values at which all the values of signals S3, which are the image signals S1 after the correction, are at a maximum value which can be taken as the signal value after the correction, and these values are stored in the correction table 16. Then, a subject is actually photographed to obtain image signals S1, and the image signals S1 are corrected for the offsets and gains by an offset adjusting means 11 and an AGC amplifier, on the basis of the offset correction values and the gain correction values stored in the correction table 16.

15 Claims, 9 Drawing Sheets

DETECTION SIGNAL CORRECTION METHOD AND DEVICE AS WELL AS SOLID-STATE DETECTOR FOR USE THEREWITH

BACKGROUND OF THE INVENTION

1. Field of the Invention

The present invention relates to a method and device for correcting a detection signal output from a solid-state detector, as well as a solid-state detector having a correcting capability for use therewith, and more specifically, to a device and a method for correcting an image signal or other signal which is output from such a solid-state detector as a solid-state image sensor, including a CCD image sensor which detects visible light and outputs an image signal, and a radiation solid-state detector which detects radiation and outputs an image signal, and a solid-state detector having this correcting capability.

2. Description of the Prior Art

Up to now, solid-state image sensors such as a CCD image sensor, which detects visible light and outputs an image signal, have been widely used in such applications as video cameras and digital still cameras. This solid-state image sensor comprises a number of photoelectric transducers disposed in the form of a matrix (for color applications, a color filter is further overlaid upon each photoelectric transducer) outputting an image signal (consisting of pixel signals each representing the signal value of each pixel) carrying a visible image as two-dimensional matrix information.

Nowadays, in the field of radiation photography for medical diagnosis, a variety of radiation solid-state detectors (mainly consisting of a semiconductor, and hereafter may be simply called "detectors"), which detect radiation in a form of latent electric charges of an amount corresponding to the dose of the radiation to which the detectors have been exposed and record the radiation image in a form of an electrostatic latent image and output an image signal carrying the recorded electrostatic latent image, have been proposed and put to practical use. As a typical one of the various types of radiation solid-state detectors proposed, the radiation solid-state detector of photoelectric conversion type, which reads out the stored charges (also called the "latent image charges") carrying image information by means of thin film transistors (TFTs), a direct conversion type and an improved direct conversion type, a mode of the direct conversion type (also called "light reading type") wherein the reading light is projected for scanning and reading out the latent image charges, are available. These types will be explained in the section titled "DESCRIPTION OF THE PREFERRED EMBODIMENTS".

With any one of the above-mentioned various types of radiation solid-state detectors, the solid-state detecting elements are disposed in the form of a matrix, and the output is an image signal (consisting of pixel signals each representing the signal value of each pixel) representing a radiation image as two-dimensional information.

Hereinbelow, a solid-state image sensor which detects visible light and outputs an image signal representing a visible image as two-dimensional matrix information and a radiation solid-state detector which detects radiation and outputs an image signal representing a radiation image as two-dimensional matrix information are collectively referred to as "solid-state image detectors." When a solid-state image detector can output not only two-dimensional, but also one-dimensional information, it is referred to as a "solid-state detector". A variety of elements, such as the photoelectric transducer constituting a solid-state image sensor and the solid-state detecting element constituting a radiation solid-state detector (described later) are collectively called "detecting elements".

With the detecting elements constituting a solid-state image detector as stated above, the characteristic of quantity of incident light or dose of incident radiation versus output signal value (hereafter called the "input-output characteristic") varies from element to element, and if uniform radiation or light (hereafter generically called "uniform radiation") is projected on the entire surface of the solid-state image detector, the image signals output from the detecting elements constituting the solid-state image detector will have variations.

The variations in input-output characteristic results from various factors, such as the variations in the sensitivity of the detecting elements, variations in load capacity of the detecting elements, and variations in the gain and offset voltages of the output amplifiers connected to the detecting elements to output the detected image signals. Also, these variations cause the image signals to have noise, and if image output is carried out on the basis of the image signals having such variations, the output image will include noise and have a deteriorated image quality.

To correct these variations of the image signals, methods for correcting the image signals output from a solid-state image detector have been proposed (for example, Japanese Unexamined Patent Publication No. 7 (1995)-72256).

With this image signal correcting method, the correction is made for each of the detecting elements (the solid-state light detecting elements) constituting a radiation solid-state detector (or for each group of elements comprising a set number of detecting elements) so that the values of the image signals when radiation is not projected (hereafter called "in the dark state") is nullified. When the correction values for the image signals when uniform radiation is projected so that the detecting elements are irradiated with an equal dose of radiation (hereafter called "in the bright state") that is approximately the same for all the detecting elements (or the groups of elements) are determined, the output image signals from the radiation detector are corrected based on these correction values. Also, the offset correction values, for correcting so that the values of the image signals in the dark state are nullified, and the gain correction values, for correcting so that the image signals in the bright state are approximately the same for all the detecting elements (or the groups of elements), are used as the correction values in the correction. Thus, this method to be used suppresses the noise which would be included in the image signals, allowing a high-quality radiation image to be output.

However, with the above-mentioned signal correcting method, the specification only states that the correction is made so that the values after the correction in the bright state are roughly uniform for all the detecting elements (or the groups of elements). The specific value that is to be selected is not stated. Depending upon the value, a problem may occur in that, when radiation having a dose of radiation that would saturate the detecting elements is projected onto all of the detecting elements, the value for one pixel is transformed into a maximum value which can be taken after the correction, while that for another pixel is transformed into a value less than the maximum, resulting in the image signals after the correction having variations. In other words, the correction made is insufficient.

For example, assume that the image signal of a detecting element "a", which has an image signal value of 50 in the dark state and an image signal value of 800 in the bright state, and the image signal of a detecting element "b", which has an image signal value of 30 in the dark state and an image signal value of 900 in the bright state, are corrected in accordance with the correcting method of the reference cited. It is also assumed that the saturation values of either of the output image signals from the detecting elements "a" and "b" is 1000, and the maximum value which can be taken after the correction is also 1000.

First, the offset correction is made so that either of the image signal values in the dark state is nullified. On the other hand, it is assumed that the gain correction is made so that both of the values after the correction in the bright state are 800, in other words, the image signal of the detecting element "a" is transformed from 800 to 800, and the image signal of the detecting element "b" is transformed from 900 to 800.

When radiation, having a dose of radiation at a level at which the output image signal from the detecting means "a" or "b" is saturated, is projected, the image signal of the detecting means "a" has a value of 1000, which is the saturation value for that image signal, and the value after the correction is also 1000, which is its maximum value after the correction. On the other hand, the image signal of the detecting means "b" also has a value of 1000, which is the saturation value for that image signal, but the value after the correction is approximately 900. Thus, the image signal values after the correction have a variation. If image output is carried out on the basis of the image signals after the correction having variations such as this, a problem exists in that the signal for one pixel is saturated while that for another pixel is not saturated. In other words, pixels whose signals are not saturated appear as granular noise, resulting in a difficult-to-view image.

The first pixel signal correction method according to the invention is a pixel signal correction method for correcting output pixel signals from a solid-state detector which detects visible light or radiation and obtains pixel signals each representing a signal value of a pixel, wherein said correction is made so that, when light or radiation at which one of the output pixel signals is at the saturation level is projected onto said solid-state detector, all the pixel signals are at a maximum value which can be taken as the signal value.

Here, the "solid-state detector" is a detector having a number of solid-state detecting elements (corresponding to pixels) mainly composed of semiconductor elements which detect visible light or radiation, mainly consisting of a semiconductor, and is exemplified by the above-mentioned photoelectric transducer and solid-state detecting element. The solid-state detecting element is a detector having a number of detecting elements as defined above, and is exemplified by the above mentioned solid-state image sensor and radiation solid-state detector. This solid-state detector may be in the one dimensional form or the two-dimensional form. This is the same hereafter.

The second pixel signal correction method according to the invention is a pixel signal correction method for correcting output pixel signals from a solid-state detector which detects visible light or radiation and obtains pixel signals each representing a signal value of a pixel, wherein the greatest pixel signal value of the pixel signals when light or radiation, at which any one of the pixel signals of said detector is at a level lower than the saturation level, is projected onto said solid-state detector is determined, said correction is made for each of said pixel signals so that the signal value of each pixel exceeds said greatest pixel signal value.

Here, "the greatest pixel signal value" means the greatest pixel signal value when the input-output characteristic of the detecting elements has a positive characteristic (the pixel signal value is increased as the quantity of light or the dose of radiation is increased). When the input-output characteristic is negative (the pixel signal value is decreased as the quantity of light or the dose of radiation is increased), the phrase "the greatest pixel signal value" should be replaced with the phrase "the smallest pixel signal value" and the phrase "for each of the pixel signals, the correction is made so that the signal value exceeds the greatest pixel signal value" as given in the above paragraph should be replaced with the phrase "for each of the pixel signals, the correction is made so that the signal value is less than the smallest pixel signal value". Thus, through the replacement of the pertinent phrases and statements according to the input-output characteristic, the specification of the present invention covers not only application where the input-output characteristic of the detecting elements is positive, but also an application where the input-output characteristics is negative.

The first pixel signal correction device according to the present invention is a device which realizes the above-stated first pixel signal correction method, i. e., a pixel signal correction device which corrects output pixel signals from a solid-state detector which detects visible light or radiation and obtains pixel signals each representing a signal value of a pixel comprising:

irradiating means which irradiates said solid-state detector with light or radiation at a level at which one of the pixel signals of said detector is at the saturation level; and correcting means which makes said correction so that all the pixel signal values, in the state where light or irradiation is provided at which anyone of said pixel signals reaches the saturated level, are at a maximum value which can be taken as the signal value.

The second pixel signal correction device according to the present invention is a device which realizes the above-stated second detection signal correction method, i. e., a pixel signal correction device which corrects output pixel signals from a solid-state detector which detects visible light or radiation and obtains pixel signals each representing a signal value of a pixel comprising:

irradiating means which irradiates said solid-state detector with light or radiation at a level at which anyone of the pixel signals is at a level lower than the saturation level; and correcting means which determines the greatest pixel signal value in the state where light or irradiation is provided at a level lower than said saturation level, said correction is made for each of the pixel signals so that the signal value exceeds said greatest pixel signal value.

As the solid-state detector for use in the above-mentioned pixel signal correction method and apparatus, various types of detectors can be used. For example, it is possible to use a light read-out type radiation solid-state detector comprising a first electrode layer, a photoconductive recording layer which shows conductivity upon exposure to recording light, a photoconductive read-out layer which shows conductivity upon exposure to reading light, and a second electrode layer provided with a stripe electrode consisting of a number of linear electrodes.

Further, it is possible to use a solid-state detector as disclosed in Japanese Patent Application No. 11 (1999)-87923, i. e. a solid-state detector comprising a first electrode layer provided with a first stripe electrode consisting of a number of linear electrodes, a photoconductive recording layer which shows conductivity upon its exposure to recording light, an electric storing portion for storing electric charges generated in said photoconductive recording layer, a photoconductive pre-exposure layer which shows conductivity upon its exposure to pre-exposure irradiation for uniformly charging said storing portion, and a second electrode layer provided with a second stripe electrode consisting of a number of linear electrodes arranged to cross with said linear electrodes of said first stripe electrode, said layers and portion being disposed in the above order.

It is further possible to use a solid-state detector as also disclosed in Japanese Patent Application No. 11 (1999)-87923, i. e. a solid-state detector comprising a first electrode layer provided with a first stripe electrode consisting of a number of linear electrodes, a photoconductive recording layer which shows conductivity upon its exposure to pre-exposure light and recording light, an electric storing portion for storing electric charges generated in said photoconductive recording layer, a dielectric layer, and a second electrode layer provided with a second stripe electrode consisting of a number of linear electrodes arranged to cross with said linear electrodes of said first stripe electrode, said layers and portion being disposed in the above order.

It is also possible to use a solid-state detector as also disclosed in Japanese Patent Application No. 11 (1999)-232763, i. e. a solid-state detector comprising a first electrode layer provided with a first stripe electrode consisting of a number of linear electrodes, a photoconductive recording layer which shows conductivity upon its exposure to recording light, an electric storing portion for storing electric charges generated in said photoconductive recording layer, a rectifying layer, and a second electrode layer provided with a second stripe electrode consisting of a number of linear electrodes arranged to cross with said linear electrodes of said first stripe electrode, said layers and portion being disposed in the above order.

Here, the "recording light" means not only an electromagnetic wave emitted directly from a source of light or radiation (for example, visible light), but also an electromagnetic wave emitted from a phosphor or the like stimulated by such electromagnetic wave (for example, visible light) having a different wavelength from that of such electromagnetic wave.

The first solid-state detector according to the present invention is a solid-state detector having the above-stated first pixel signal correcting capability, i. e., a solid-state detector which detects visible light or radiation and obtains pixel signals each representing a signal value of a pixel comprising:

correcting means which corrects the output pixel signals from said detector so that all the pixel signal values when light or radiation at a level at which one of the pixel signals is at the saturation level is projected on said detector, are at a maximum which can be taken as the signal value.

The second solid-state detector according to the present invention is a solid-state detector having the above-stated second pixel signal correcting capability, i. e., a solid-state detector which detects visible light or radiation and obtains pixel signals each representing a signal value of a pixel comprising:

correcting means which determines the greatest pixel signal value when light or radiation at a level at which any one of the output pixel signals of said detecting elements is at a level lower than the saturation level is projected on said detector, and corrects the output pixel signals from said detector so that the signal value of each of the pixel signals exceeds said greatest pixel signal value.

With the first pixel signal correcting method and device according to the present invention, as well as the solid-state detector having the correcting capability, the correction is made so that, when light or radiation at a level at which any one of the pixel signals is at the saturation level (hereafter called light having "a maximum quantity of light" or radiation having "a maximum dose of radiation") is projected onto the detector, all the signal values of the output signals are at a maximum value which can be taken as the signal value. Therefore, if the detecting elements have variations in input-output characteristic, the values of the signals (pixel signal), when photographing is carried out under the condition that for one of the detecting elements a maximum quantity of light or a maximum dose of radiation is provided, are transformed after the correction into a maximum value that can always be taken by the signals after the correction (pixel signal after correction) of all the detecting elements. Thus, the image signals when photographing is carried out with a maximum quantity of light or a maximum dose of radiation are free from variations, which allows a high-quality image to be offered.

With the second detection signal correcting method and device according to the present invention, as well as the solid-state detector having the correcting capability, the greatest output signal value of the values of the output signals, when light or radiation at a level at which anyone of the detection signals is at a level lower than the saturation level is projected onto the detecting means of the solid-state detector, is determined, and for each of the output signals, the correction is made so that the signal value exceeds the greatest output signal value. Therefore, as long as the dynamic ranges for the image signals are approximately the same (later described in detail), as stated above, the values of the signals of the detection elements, when photographing is carried out under the condition that for one of the detecting elements a maximum quantity of light or a maximum dose of radiation is provided, are transformed after the correction into a maximum value which can be taken by the signals after the correction of all the detecting elements without fail. Thus, the image signals when photographing is carried out with a maximum quantity of light or a maximum dose of radiation are free from variations, which allows a high-quality image to be offered.

SUMMARY OF THE INVENTION

The purpose of the present invention is to provide a detection signal correcting method and a detection signal correcting device wherein, in correcting the variations in input-output characteristic of the detecting elements, the correction is made so that, when light having a quantity or radiation having a dosage at a level at which the detection signals output from the detecting elements are saturated is projected, the signals after the correction have no variations, as well as a solid-state detector which can realize the detection signal correcting method (hereafter referred to as "having a correcting capability").

DESCRIPTION OF THE PREFERRED EMBODIMENTS

Hereinbelow, embodiments of the present invention will be described in detail with reference to the drawings.

First, the above-stated three types of radiation solid-state detectors for use in the embodiments of the present invention will be described hereinbelow. The present invention is not limited to these three types of radiation solid-state detectors, and any type of solid-state detector may be used, so long as the solid-state detector mainly consists of a semiconductor, being configured by disposing a number of elements for detecting visible light or radiation. For example, some other type of radiation solid-state detector which detects radiation and outputs image signals; a CCD image sensor which detects visible light and putouts image signals, and other solid-state image sensors may be used. Also, the solid-state detector may be in the one-dimensional form or the two-dimensional form.

With the radiation solid-state detector of the photoelectric conversion type, a two-dimensional image reading section in which a plurality of photoelectric transducers (each having a capability of storing a detection charge) as detecting elements each corresponding to a particular pixel are two-dimensionally formed on an insulated substrate, and a fluorescent substance layer (also called a scintillator) which, when irradiated with radiation carrying image information formed on this two dimensional image reading section, converts the radiation into visible light carrying the image information, are stacked together. In reading out the stored charges (the latent image charges) carrying image information as detection signals from this type of radiation solid-state detector, the photoelectrictransducers are scanned and driven by means of a TFT which is connected to each photoelectric transducer.

As radiation solid-state detectors of this type, those as desclosed in Japanese unexamined Patent Publication Nos. 59 (1984)-211263, 2(1990)-164067, PCT International Publication No. WO92/06501, and "Signal, noise, and read out considerations in the development of amorphous silicon photodiode arrays for radiotherapy and diagnostic x-ray imaging", L. E. Antonuk et. al, university of Michigan, R. A. Street Xerox, PARC, SPIE vol. 1443 Medical Imaging V, Image Physics (1991), p. 108–119, for example, have been proposed.

Next, with the radiation solid-state detector of direct conversion type, a two-dimensional image reading section in which a plurality of charge collection electrodes each corresponding to a particular pixel are two-dimensionally formed on an insulated substrate, and radiation conductors which, when irradiated with radiation carrying image information formed on this two-dimensional image reading section, generate charges carrying the image information, are stacked together. Thus, with this type, the detecting element mainly consists of a charge collection electrode and a radiation conductor. In reading out the stored charges (the latent image charges) carrying image information as detection signals from this type of radiation solid-state detector, as is the case with the above-stated photoelectric conversion type, the detecting elements are scanned and driven by means of a TFT which is connected to each detecting element.

As radiation solid-state detectors of this direct conversion type, (i) a radiation solid-state detector having 10 times as large a thickness along the direction of radiation penetration as that of a general detector (MATERIAL PARAMETERS IN THICK HYDROGENATED MORPHOUS SILICON RADIATION DETECTORS, Lawrence Berkeley Laboratory. University of California, Berkeley. Calif. 94720 Xerox Parco Palo Alto, Calif. 94304), (ii) a radiation solid-state detector in which two or more layers are stacked in the direction of radiation penetration with a metallic sheet being placed between layers (Metal/Amorphous Silicon Multi-layer Radiation Detectors, IEE TRANSACTIONS ON NUCLEAR SCIENCE. VOL. 36. NO. 2. APRIL 1989), and (iii) a radiation solid-state detector which CdTe or other (Japanese uses unexamined Patent Publication No. 1 (1989)-216290) have been proposed, for example.

Further, it is possible to use a light read-out type radiation solid-state detector comprising a first electrode layer, a photoconductive recording layer which shows conductivity upon exposure to recording light, a photoconductive read-out layer which shows conductivity upon exposure to reading light, and a second electrode layer provided with a stripe electrode consisting of a number of linear electrodes. As the light read-out type radiation solid-state detector, can be used the radiation solid-state detector of improved direct conversion type, wherein the electromagnetic radiation (for example, visible light) for reading is projected for scanning and reading out as proposed in Japanese Patent Application No. 10 (1998)-232824 by the present applicant. This detector (see FIG. 6) comprises a first conductor layer 61 having a permeability to radiation for recording; a photoconductive layer 62 for recording which exhibits a photo-conductivity (exactly, a radiation-conductivity), when irradiated with the radiation for recording which has penetrated through the first photoconductive layer; a charge transporting layer 63 which acts almost as an insulator for a charge having the same polarity as that of the charges provided in the first conductor layer, while acting roughly as a conductor for a charge having a polarity opposite to that of the charges; a photoconductive layer 64 for reading which exhibits a photoconductivity (exactly, an electromagnetic radiation-conductivity), when irradiated with radiation 60 for reading; and a second conductor layer 65 having a permeability to electoromagnetic radiation for reading, are stacked together in this order. The latent image charges carrying image information are stored in an electric charge storing portion formed on the boundary surface between the recording photoconductive layer and the charge transporting layer. The first conductor layer and the second conductor layer each act as an electrode. With this mode, the detecting element mainly consists of a photoconductive layer for recording, a charge transporting layer, and a photoconductive layer for reading.

Figure 6:
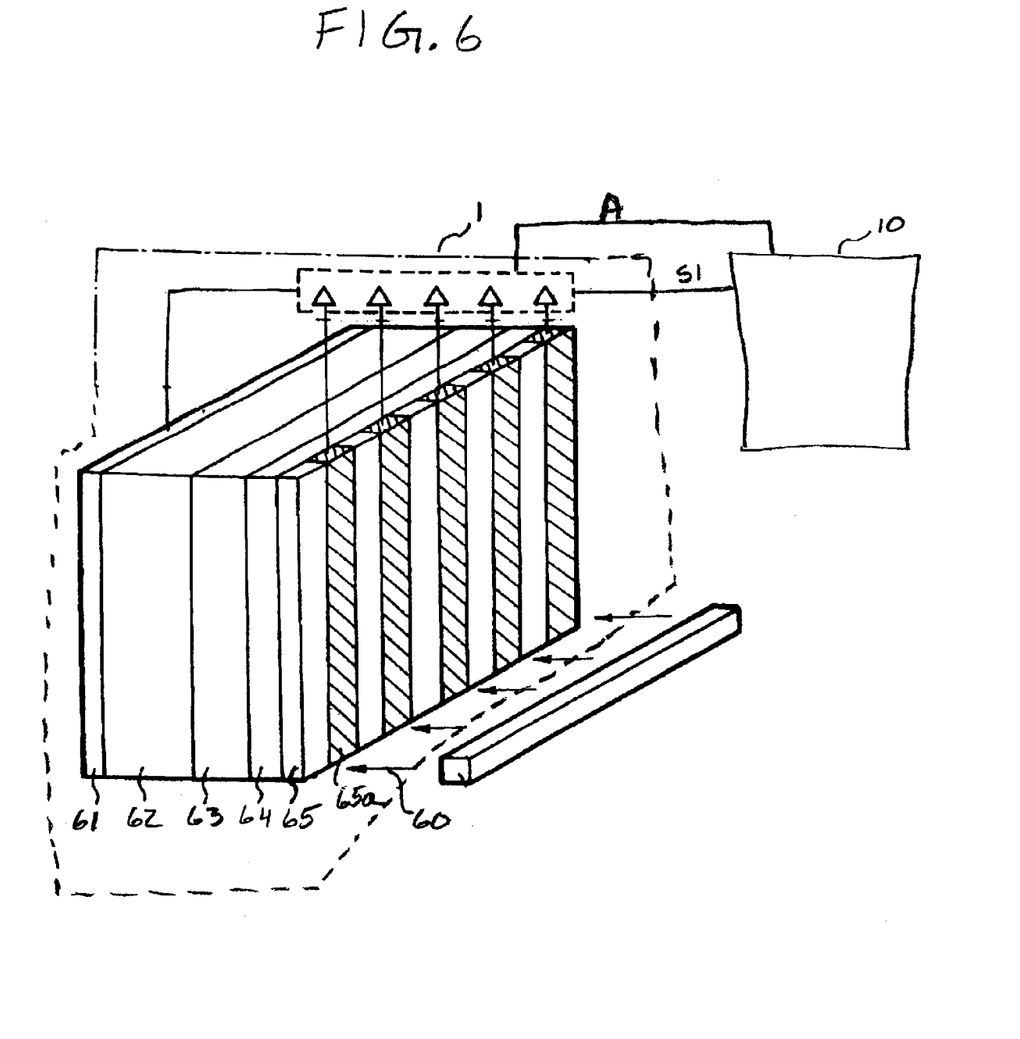
FIG. 6 shows a solid-state radiation detector.

With this improved direct conversion type of radiation solid-state detector, as modes where the electrostatic latent image carried by the latent image charges are read out, available modes are the mode where the second conductor layer (hereafter called the "reading electrode") is formed in a flat sheet, and this reading electrode is scanned with a spot-like beam of laser or other type of reading light to detect the latent image charges, and the mode wherein the reading electrode is provided as striped electrodes (65a), and the line light sources extending in the direction approximately perpendicular to the longitudinal direction of the stripy electrodes are scanned along the longitudinal direction of the stripy electrodes to detect the latent image charges.

Figure 7:
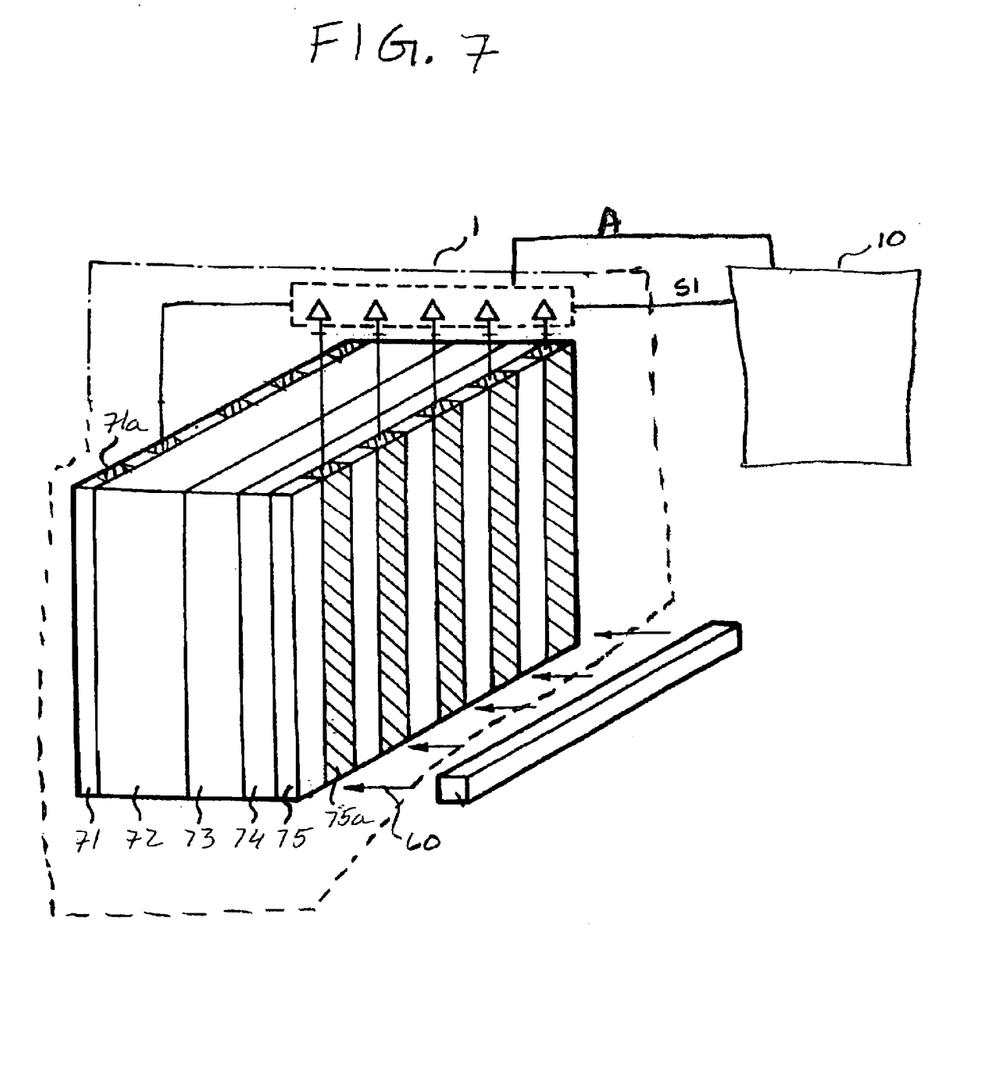
FIG. 7 shows a solid-state radiation detector.

Further, it is possible to use a solid-state detector (see FIG. 7) as disclosed in Japanese Patent Application No. 11 (1999)-87923, i.e. a solid-state detector comprising a first electrode layer (71) provided with a first stripe electrode (71a) consisting of a number of linear electrodes, a photoconductive recording layer (72) which shows conductivity upon its exposure to recording light, an electric storing portion (73) for storing electric charges generated in said photoconductive recording layer, a photoconductive pre-exposure layer (74) which shows conductivity upon its exposure to pre-exposure irradiation for uniformly charging said storing portion, and a second electrode layer (75) provided with a second stripe electrode (75a) consisting of a number of linear electrodes arranged to cross with said linear electrodes of said first stripe electrode, said layers and portion being disposed in the above order.

Figure 8:
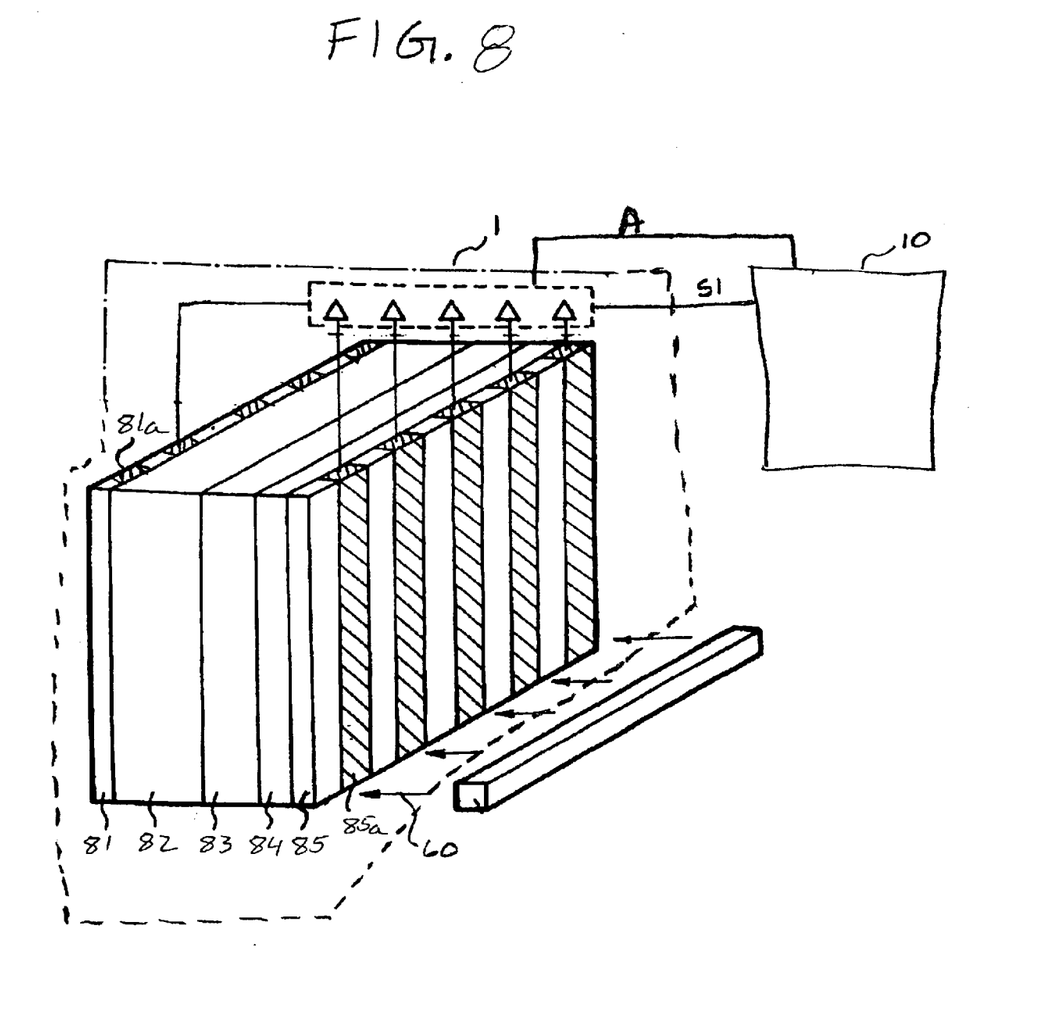
FIG. 8 shows a solid-state radiation detector.

It is further possible to use a solid-state detector (see FIG. 8) as also disclosed in Japanese Patent Application No. 11 (1999)-87923, i.e. a solid-state detector comprising a first electrode layer (81) provided with a first stripe electrode (81a) consisting of a number of linear electrodes, a photoconductive recording layer (82) which shows conductivity upon its exposure to pre-exposure light and recording light, an electric storing portion (83) for storing electric charges generated in said photoconductive recording layer, a dielectric layer (84), and a second electrode layer (85) provided with a second stripe electrode (85a) consisting of a number of linear electrodes arranged to cross with said linear electrodes of said first stripe electrode, said layers and portion being disposed in the above order.

Figure 9:
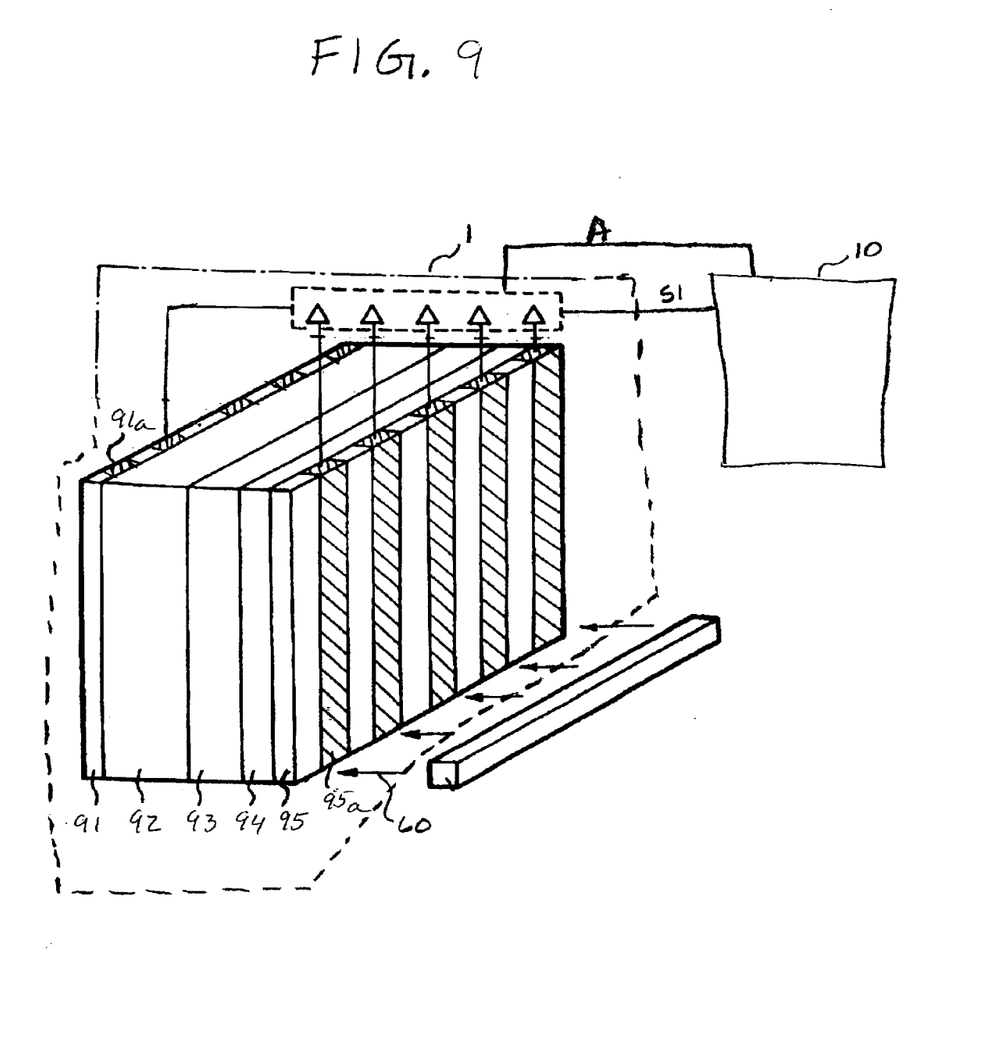
FIG. 9 shows a solid-state radiation detector.

It is also possible to use a solid-state detector (FIG. 9) as also disclosed in Japanese Patent Application No. 11 (1999)-232763, i.e. a solid-state detector comprising a first electrode layer (91) provided with a first stripe electrode (91a) consisting of a number of linear electrodes, a photoconductive recording layer (92) which shows conductivity upon its exposure to recording light, an electric storing portion (93) for storing electric charges generated in said photoconductive recording layer, a rectifying layer (94), and a second electrode layer (95) provided with a second stripe electrode (95a) consisting of a number of linear electrodes arranged to cross with said linear electrodes of said first stripe electrode, said layers and portion being disposed in the above order.

Hereinbelow, a first embodiment of the detection signal correction device realizing the detection signal correction method according to the present invention will be explained.

Figure 1:
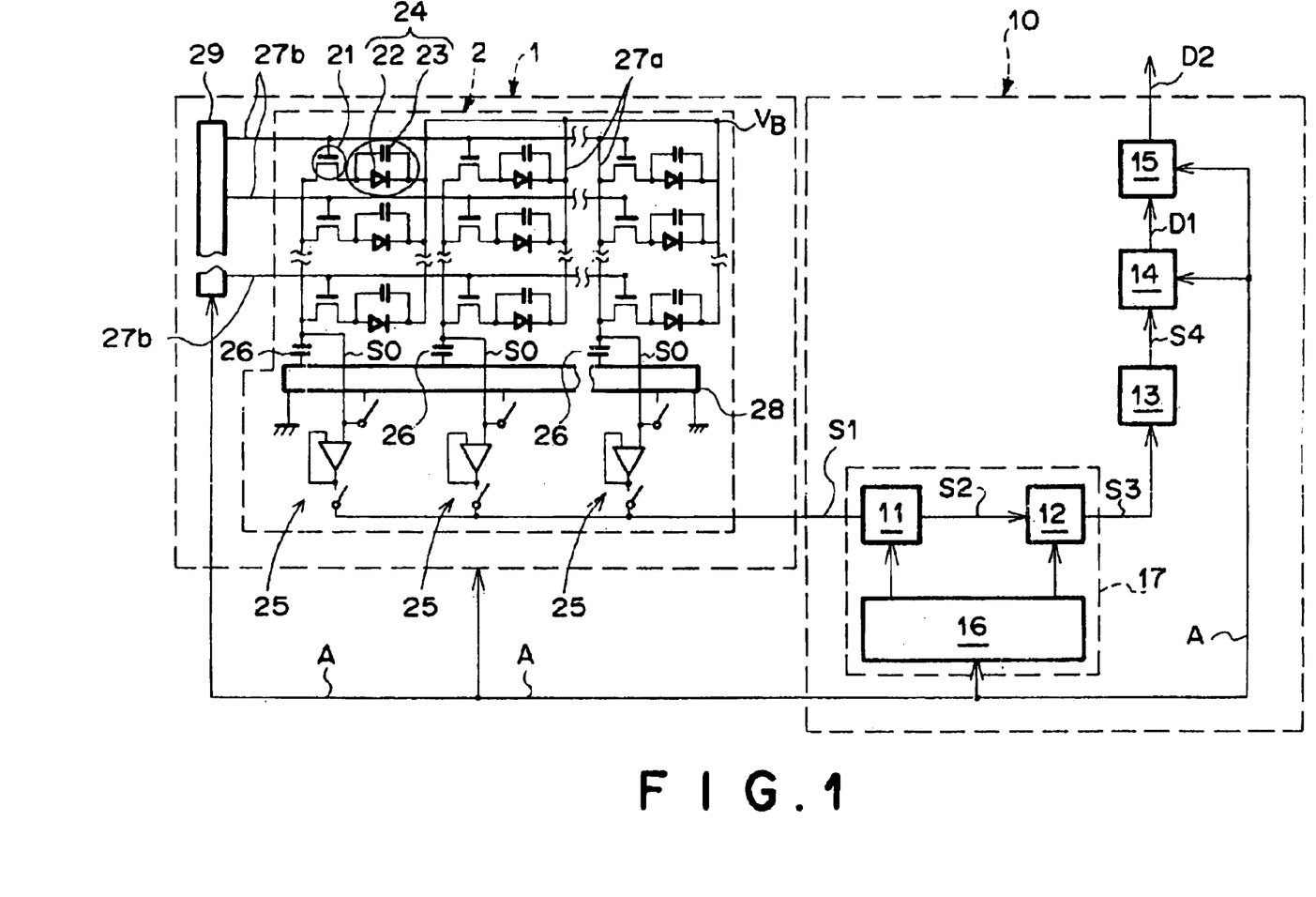
FIG. 1 is a drawing illustrating an image signal correction device according to a first embodiment of the present invention together with a radiation solid-state detector.
Figure 2:
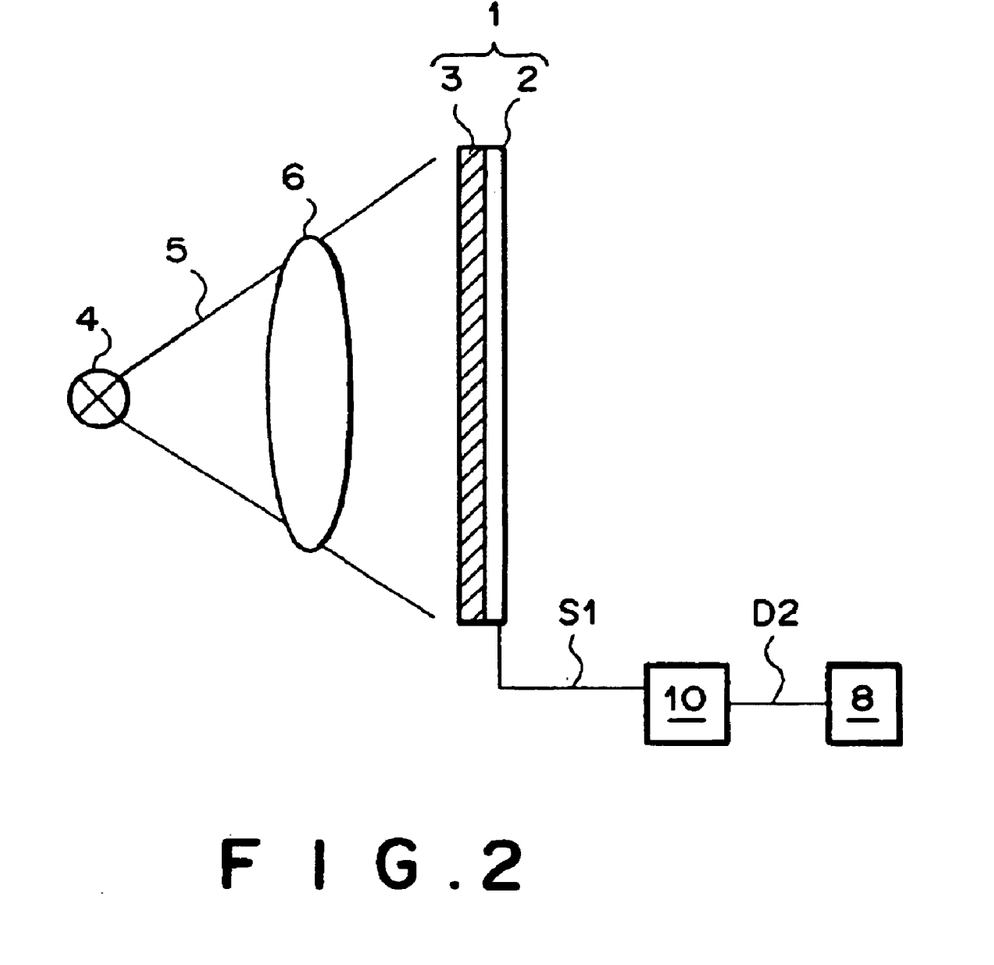
FIG. 2 is a drawing showing an image signal reading device using an image signal correction device according to the present invention.

FIG. 1 shows a drawing illustrating an image signal correction device 10 as an embodiment of the detection signal correction device according to the present invention together with a radiation solid-state detector 1, and FIG. 2 shows a drawing expressing the general configuration of an image signal reading device using the image signal correction device 10. As shown in these figures, the image signal correction device 10 is connected with the photoelectric conversion type radiation solid-state detector 1 comprising a scintillator 3 which converts projected radiation into visible light and a two-dimensional image reading section 2. The image signal correction device 10 is equipped with an X-ray source 4 (see FIG. 2), and is further connected to reproducing means 8 which outputs the radiation of a subject 6 as a visible image. As the reproducing means 8, various devices including a CRT, which electronically provides a display, and a video printer which records a radiation image displayed on a CRT can be adopted. A radiation image of the subject 6 may be recorded and stored on a magnetic tape, an optical disk, or other medium.

As shown in FIG. 1, the two-dimensional image reading section 2 of the radiation solid-state detector 1 has a number of photoelectric transducers 24 disposed two-dimensionally, each as a detecting element comprising a photoelectric conversion section 22 which detects visible light as a result of the conversion by a scintillator (not shown) and converts this visible light into a detection signal SO in analog form (hereafter called an image signal, in this example) carrying the radiation image of a part of the subject, and a capacitor 23 which temporarily stores the signal electric charge (the image signal) as a result of the conversion by this photoelectric conversion section 22.

The two-dimensional image reading section 2 is provided with an output amplifier 25 for each column to amplify the image signals SO output from the photoelectric transducers 24 vertically disposed in FIG. 1, and further a load capacitor 26 for each column to temporarily store the image signal so output from each photoelectric transducer 24.

As shown in FIG. 1, the photoelectric transducer 24 is connected with a transferring section 21 comprising a TFT to transfer the signal charge stored in the capacitor 23. The output of each transferring section 21 is connected with a signal line 27a, and the signal line 27a is connected with the output amplifier, extending vertically, and with a multiplexer 28 through the load capacitor 26. On the other hand, the gate of each transferring section 21 is connected with a scanning line 27b, and the scanning line 27b is connected with a scanning pulse generator 29, extending horizontally in FIG. 1. The cathode side of the photoelectric transducer 24 is connected with an internal power supply VB.

Thus, the signal line 27a and the scanning line 27b are connected with the thin film transistors (TFTs), each as the transferring section 21, and in accordance with the scanning control by the scanning pulse generator 29, an image signal S1 of the photoelectric transducers 24 each corresponding to a particular pixel is output through the output amplifier 25.

On the other hand, the drawing illustrating an image signal correction device 10 has offset adjusting means 11 to adjust the offsets of the image signal S1 output from the detector 1, an automatic gain control amplifier 12 (hereafter called an AGC amplifier) as gain adjusting means to adjust the gains of an image signal S2 which are offset adjusted, logarithmic transforming means 13 to logarithmically transform an image signal S3 output from the AGC amplifier 12, an A/D converter 14 to convert a logarithmically transformed image signal S4 into a digital image signal D1, and a frame memory 15 to temporarily store an A/D converted image signal D1. Further, it has a correction table 16 to store the correction values for adjusting the offsets and gains of the image signal S1 output from the detector 1 and to input these correction values to the offset adjusting means 11 and the AGC 12. The offset adjusting means 11, the AGC 12, and the correction table 16 constitute correcting means 17 of the present invention.

Next, the function of this image signal correction device 10 will be explained.

First, in the state wherein X-rays 5 are not emitted from the X-ray source 4, i. e., in the "dark" state, an image signal S1 is read out from the detector 1. In other words, from the scanning pulse generator 29 as shown in FIG. 1, a transfer pulse is fed to the photoelectric transducers 24 disposed horizontally in one row in FIG. 1 from the scanning pulse generator 29, resulting in the switches for the photoelectric transducers 24 in the uppermost row being turned "on". This causes the signal charges in the photoelectric transducers 24 in the uppermost row to be simultaneously fed to the multiplexer 28, being temporality stored in the load capacitors 26. Then, by turning the switches for the output amplifiers 25, the signal charges stored in the load capacitors 26 are output, amplified by the output amplifiers 25, and output as an image signal S1 from the detector 1.

The image signal S1 output from the detector 1 is passed through the offset adjusting means 11 and the AGC 12, and logarithmically transformed and converted into a digital signal by the logarithmic transforming means 13 and the A/D converter 14, respectively, before being input to the frame memory 15. This operation is performed for all the vertically disposed lines of photoelectric transducers 24 constituting the detector 1 to obtain an image signal S1 for each line.

Here, with an image signal S1 in the dark state which is output from the detector 1, the image signal S1 must have a value of 0 no matter which photoelectric transducer 24 it is output from, because the detector 1 is not irradiated with X-rays 5. However, because of the difference in sensitivity between photoelectric transducers 24, the variations in offset voltage of the output amplifiers 25, and the errors of the load capacitors 26, the values of all the image signals S1 are not always 0. Therefore, the values of the image signals S1 of the photoelectric transducers 24 output from the lines of photoelectric transducers 24 constituting the detector 1 in the state where the X-rays 5 are not projected are input to the correction table 16 from the frame memory 15 as offset values. By repeating such processing from the uppermost line to the lowermost line in sequence, the offset correction value for each of the photoelectric transducers 24 in each line is stored in the correction table 16.

Then, in the state where the above-mentioned offset values are input to the offset adjusting means 11 to nullify the offsets, the X-rays 5 are emitted from the X-ray source 4, and in the state wherein the X-rays 5 having a set radiation dose are uniformly projected on the detector 1, the image signals S1 are read out from the detector 1. In other words, as in the above-mentioned dark state, where the X-rays 5 are not projected, the image signal so is read out for each of the photoelectric transducers 24 in each of the lines of photoelectric transducers 24 disposed horizontally in FIG. 1 constituting the detector. The image signal S1 read out is corrected for the offsets with the above-mentioned offset values on the offset adjusting means 11 before being passed through the AGC amplifier 12, logarithmically transformed by the logarithmic transforming means 13, converted into a digital signal D1 by the A/D converter 14, and input to the frame memory 15. When "the X-rays 5 having a set radiation dose are uniformly projected on the detector 1" in the above statement, any method may be used. For example, the X-rays 5 having a set radiation dose may be projected on the entire surface of the detector 1 at once or the X-rays 5 with a set radiation dose may be used to scan the entire surface of the detector 1.

Here, with the image signals S1 output from the detector 1 in the state where the X-rays 5 are uniformly projected, the values of the image signals S1 output from the lines should be uniform. However, because of the difference in sensitivity between photoelectric transducers 24, the variations in gain and offset voltage of the output amplifiers 25, and further the errors of the load capacitors 26, the value of the image signal S1 varies with the line and the photoelectric transducer 24. Therefore, the variations of the image signals D1 of the photoelectric transducers 24 which are input to the frame memory 15 are determined, and on the basis of these variations, the gain correction values which make the image signals D1 of the photoelectric transducers 24 uniform are determined. The gain correction values determined are stored in the correction table 16. By repeating such processing from the uppermost line to the lowermost line in sequence, the gain correction value for each of the photoelectric transducers 24 in each line is stored in the correction table 16.

Here, in determining the gain correction values which make the image signals S3 of the photoelectric transducers 24 in the lines uniform, they are determined so that, when radiation having a dose of radiation which brings one of the image signals S1 of the photoelectric transducers 24 to the saturated level or a level close to it, i. e., a maximum dose is projected on all the photoelectric transducers 24 of the detector 1, the values of all the signals S3 after the correction of the image signals S1 are a maximum value which is capable of being taken as the signal value after the correction. Therefore, in uniformly projecting the X-rays 5 on the detector 1 in the state where the above-mentioned offsets are nullified, as stated above, radiation having a maximum dose of radiation is uniformly projected on all the photoelectric transducers 24 by the X-ray source 4 as irradiating means, i. e., it is projected without being passed through the subject 6, and in this state, the image signals S1 are read out from the detector 1 to determine the again correction values at which the values of all the signals S3 after the correction of the image signals S1 are a maximum value which is capable of being taken as the signal value after the correction.

Thus, the offset correction values and the gain correction values are determined, and stored in the correction table 16, and then the X-ray image of the subject 6 is photographed. In other words, as shown in FIG. 2, the X-rays 5 emitted from the X-ray source 4 are projected onto the subject 6, penetrating it. The X-rays 5 penetrating the subject 6 are projected onto the detector 1. The X-rays 5 projected on the detector 1 are projected on the scintillator 3 to be converted into visible light. The visible light as a result of the conversion is received by the photoelectric conversion section 22 of each of the photoelectric transducers 24 constituting the detector 1, resulting in a signal charge being generated in the photoelectric conversion section 22. Thus, in each of the photoelectric transducers 24, a signal charge in proportion to the luminance of the visible light, i. e., the energy of the incident radiation, is generated, and stored in a capacitor 23.

Then, an address signal A is sent to the scanning pulse generator 29 and the output amplifiers 25 from the frame memory 15 to read out the signal charges for a particular line. In other words, from the scanning pulse generator 29, a transfer pulse is fed to the photoelectric transducers 24 in the uppermost row, which turns "on" the switches for the photoelectric transducers 24 in the uppermost row, and thus the signal charges generated in the photoelectric conversion sections 22 are fed through the transferring sections 21. This causes the signal charges in the photoelectric transducers 24 in the uppermost row to be simultaneously fed to the multiplexer 28. From the multiplexer 28, the analog electric signal (the image signal) S1 for the uppermost row is taken out from detector 1 after being temporarily stored in the load capacitors 26 and amplified by the output amplifiers 25. By repeating this from the uppermost line to the lowermost line in sequence, the analog image signals S1 from the photoelectric transducers 24 in the lines are output from the detector 1 in sequence.

On the other hand, from the frame memory 15, an address signal A is also fed to the correction table 16, and the output image signal S1 from the detector 1 for a particular line is first corrected for the offsets with the offset correction values for the line stored in the correction table 16 in the offset adjusting means 11. Then, the image signal S2 which has been corrected for the offsets is corrected for gains with the gain correction values for the line stored in the correction table 16 on the AGC amplifier 12. The image signal S3 thus corrected for the offsets and gains is logarithmically transformed by the logarithmic transforming means 13, and converted into a digital signal D1 by the A/D converter 14 before being input to the memory 15. This processing is carried out for each line, which causes the image signals D1 in digital form carrying the radiation image information about the subject 6 to be stored in the frame memory 15.

Then, the image signals D2 after the correction are output from the frame memory 15 to be reproduced as a visible image on the reproducing means 8 as shown in FIG. 2.

Thus, with the image signal correction device according to the present invention, the offsets and the gains are adjusted for each of the lines of photoelectric transducers 24 constituting the detector 1, thus, generation of linear noise due to the difference in output between photoelectric transducers 24 in each line can be prevented, which allows a high-quality image having a satisfactory SIN ratio to be obtained.

In addition, the gains are corrected on the basis of the again correction values at a level at which, when radiation having a maximum dose of radiation is projected on the photoelectric transducers 24, the values of all the signals S3 after the correction of the image signals are at a maximum value which can be taken as the signal value after the correction. Thus, if there are differences in sensitivity between photoelectric transducers 24, variations in gain and offset voltage of the output amplifiers 25, and further, errors of the load capacitors 26 (which are collectively called variations in input-output characteristic of the photoelectric transducers 24), the values of the image signals S1 of the photoelectric transducers 24 when photographing is carried out, under the condition that for one of the photoelectric transducers 24 a maximum dose of radiation is provided, are transformed after the correction into a value greater than the maximum value which can be always taken by the image signals S3 after the correction of all the photoelectric transducers 24. Then the image signals S3 after the correction when photographing is carried out with a maximum dose of radiation are free from variations (this is also true for S4, D1, and D2), which allows a high-quality image to be provided.

Figure 3:
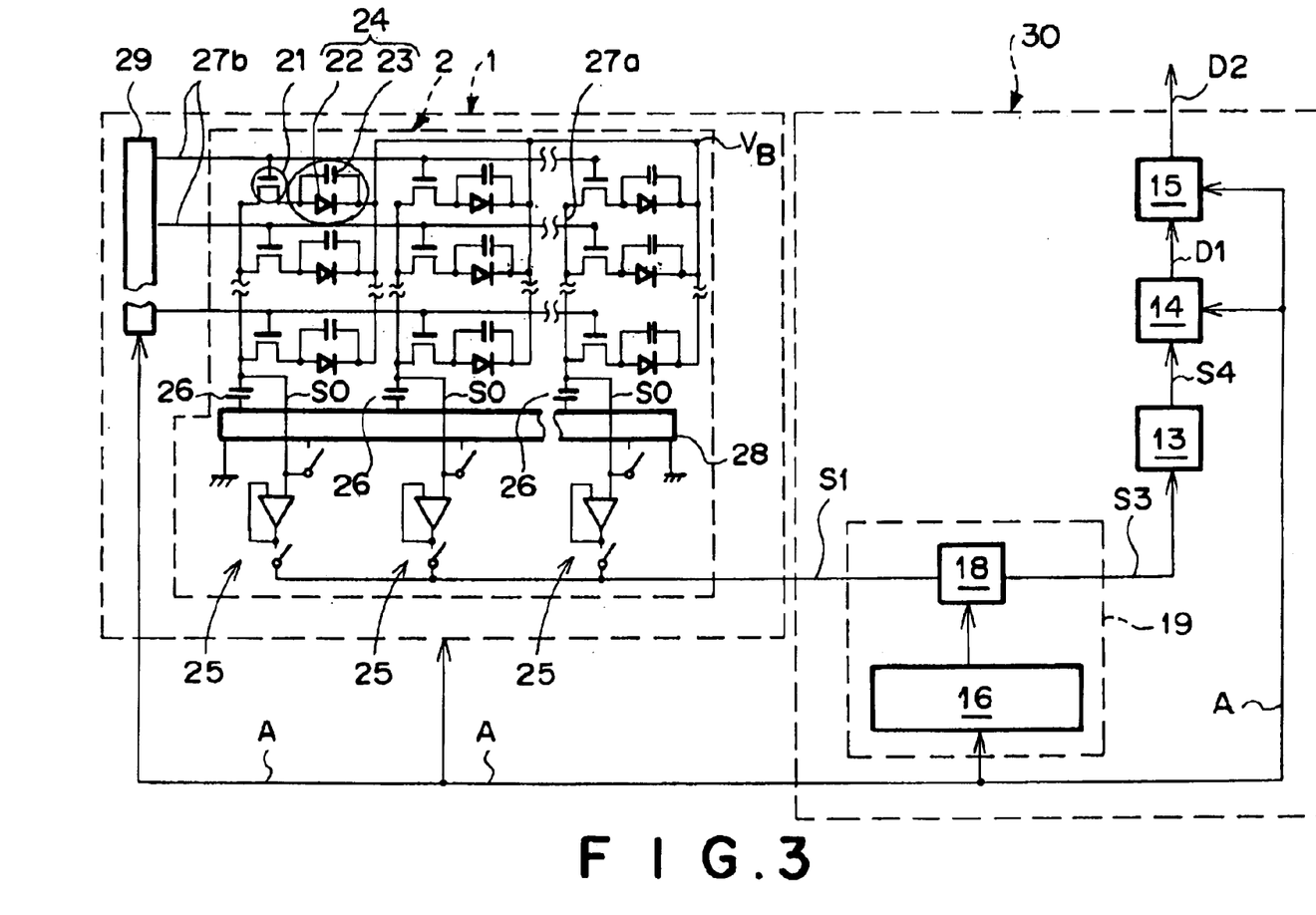
FIG. 3 is a drawing showing an image signal correction device according to a second embodiment of the present invention together with a radiation solid-state detector.

Next, a second embodiment of the detection signal correction device realizing detection method signal correction the according to the present invention will be explained. With the above image signal correction device 10, the offsets are first corrected by the offset adjusting means 11, and then the gains are corrected by the AGC amplifier 12. However, the present invention is not limited to this, and the correction of the offsets and the correction of the gains may be simultaneously performed on the basis of the two different types of correction values, namely the offset correction values and the gain correction values. FIG. 3 shows the configuration of this style of image signal correction device 30. In FIG. 3, a section having the same configuration as that of the section of the image signal correction device 10 as shown in FIG. 1 is provided with the same reference numeral, and detailed description will be omitted here.

As shown in FIG. 3, this image signal correction device 30 is equipped with an adjusting means 18 which corrects the offsets and gains of the image signals S1 output from the detector 1 on the basis of the two different types of correction values, i. e., the offset correction values and the gain correction values, stored in the correction table 16. The correction table 16 and the adjusting means 18 constitute correcting means 19 of the present invention.

First, as with the above-described image signal correction device 10, the offset correction values and the gain correction values for the photoelectric transducers 24 in the lines of photoelectric transducers 24 disposed horizontally in FIG. 3 constituting the detector 1 are determined, and stored in the correction table 16.

Then, as with the image signal correction device 10, the X-rays 5 emitted from the X-ray source 4 are projected onto the subject 6, penetrating it. The X-rays 5 penetrating the subject 6 are projected onto the detector 1. The X-rays 5 projected onto the detector 1 are projected onto the scintillator 3 to be converted into visible light. The visible light as a result of the conversion is received by each of the photoelectric transducers 24 constituting the detector 1, being photoelectrically converted. At this time, an address signal A is sent to the scanning pulse generator 29 and output amplifiers 25 from the frame memory 15, and the image signal S1 for each line is output.

On the other hand, from the frame memory 15, an address signal A is also sent to the correction table 16, as is the case with the above-described example, and the output image signal S1 for each line from the detector 1 is corrected for offsets and gains by the correcting means 19. In other words, in the adjusting means 18, the offset correction values and gain correction values stored in the correction table 16 are used to prepare a signal transformation table for transforming the offset and gain values into the proper values, and in this table, the image signal S1 output for each line from the detector 1 is corrected and an image signal S3 is output.

The image signal S3 which is thus corrected is input to the frame memory 15 after being logarithmically transformed, input to reproducing means (not shown) as a corrected image signal D2, and reproduced as a visible image by this reproducing means.

Figure 4:
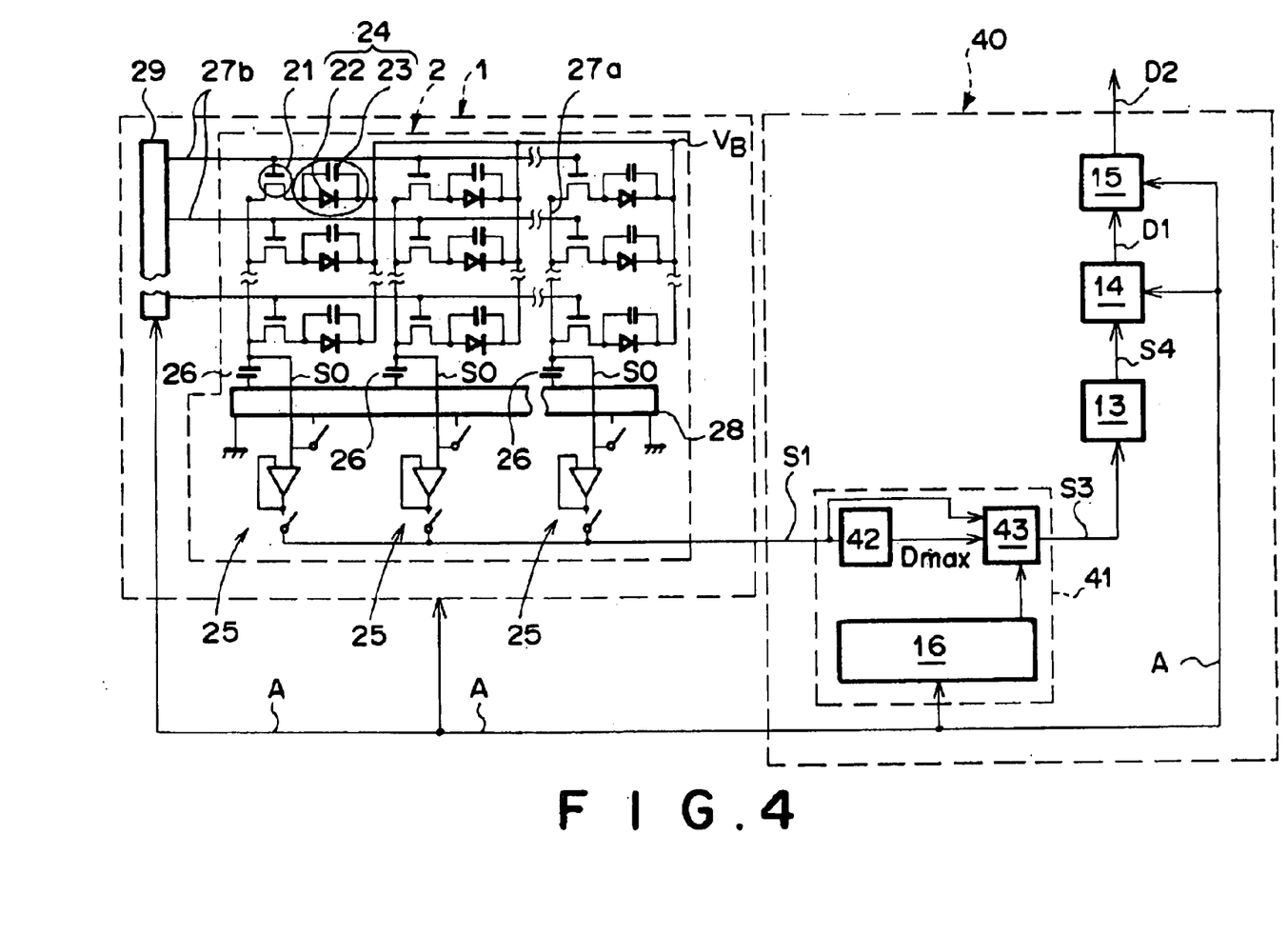
FIG. 4 is a drawing illustrating an image signal correction device according to a third embodiment of the present invention together with a radiation solid-state detector.

Next, a third embodiment of the detection signal correction device realizing method detection correcting signal the according to the present invention will be explained. This detection signal correction device 40 is different from the above-described first detection signal correction device 10 and second detection signal correction device 30 in that the greatest value of image signal (hereafter called the maximum detection value Dmax), among those of the image signals S1 when a dose of radiation which brings anyone of the image signals to a level lower than the saturated level (hereafter simply called "a dose of radiation lower than the saturated level") is projected onto all the photoelectric transducers 24 of the detector 1, is determined, and for each of the image signals, the correction is made so that the signal values after the correction are over the maximum detection value Dmax. FIG. 4 shows the configuration of this style of detection signal correction device 40. In FIG. 4, a section having the same configuration as that of the section of the image signal correction device 10 as shown in FIG. 1 is provided with the same reference numeral, and detailed description will be omitted here.

As shown in FIG. 4, this detection signal correction device 40 has the same configuration as that of the detection signal correction device 10 except that the correcting means 17 of the detection signal correction device 10 is replaced with correcting means 41, with the above-mentioned correcting means 17, in determining the gain correction values which make the image signals S3 uniform, the values are determined so that, when radiation having a maximum dose is projected onto all the photoelectric transducers 24 of the detector 1, the values of all the signals S3 after the correction of the image signals S1 are at a maximum value which is capable of being taken as the signal value after the correction. With the correcting means 41, the greatest value of image signal, among the values of the image signals S1, i.e., the maximum detection value when radiation having a dose of radiation lower than the saturated level is projected onto all the photoelectric transducers 24 of the detector 1, is determined, and for each of the image signals S1, the gain correction values are set so that the signal values after the correction become equal to or larger than the maximum detection value.

Hereinbelow, the function of the correcting means 41 will be explained.

In determining the gain correction values at which the signal values after the correction exceed the maximum detection value Dmax, radiation having a dosage lower than the saturated level is projected onto all the photoelectric transducers 24 of the detector 1. In this state, i. e., the bright state, the image signals S1 are read out from the detector 1, the greatest value of image signal among those of the image signals S1, i. e., the maximum detection value Dmax, is determined, and for each of the image signals, the gain correction values at which the signal values after the correction exceed the maximum detection value Dmax are determined. This will be specifically explained hereinbelow.

Figure 5:
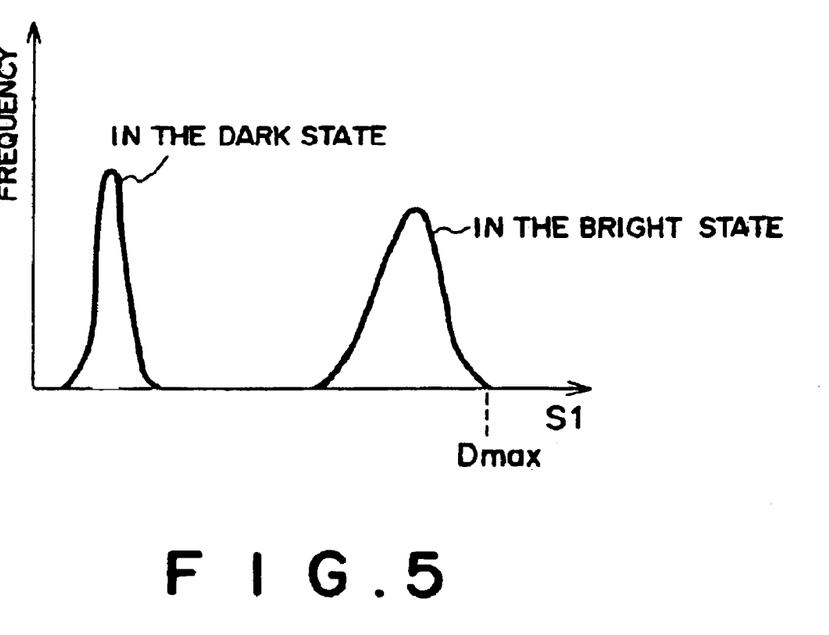
FIG. 5 shows a histogram for an image signal which is read out from a radiation detector in the dark and bright states.

FIG. 5 shows a histogram for the image signals S1 when the image signals S1 are read out from the detector 1 in the dark state where the X-rays 5 are not emitted from the X-ray source 4 and in the bright state where radiation having a dose of radiation lower than a saturated level is projected. As shown in FIG. 5, due to the variations in input output characteristic of the photoelectric transducers 24, the signal value varies in either the dark state or the bright state.

The maximum detection value acquiring means 42 in the correcting means 41 determines the maximum detection value Dmax of the normal pixel in the bright state (see FIG. 5). The pixel which provides this maximum detection value Dmax is called "the maximum detection pixel" hereafter.

Next, the correcting means 41 prepares a map (such as a function and a transformation table) in which, for the pixels, i.e., the image signals S1 of the photoelectric transducers 24, all the image signals S3 after the correction are transformed as:

S1 (in dark state)→S3 (in dark state)=0

S1 (in bright state)→S3 (in bright state)=Dmax

For example, assume that the relationship between image signal and dose of radiation is expressed by a linear function. In this case, the correction function for the image signals S1 is expressed by:

$$D'(x, y)=A(x, y)*D(x, y)+B(x, y)$$

which can be used for determining A (x, y) and B (x, y) from the image signals in both dark and bright states. Here, (x, y) denotes a pixel number, x the pixel number in the horizontal scanning direction, and y the pixel number in the vertical scanning direction. D (x, y) denotes the value of the image signal S1 for the pixel number (x, y). Similarly, D' (x, y) denotes the value of the image signal S3 after the correction, A (x, y) the gain correction value, and B (x, y) the offset correction value. The function is not limited to the linear function, and a quadratic function or other higher-order function can be used.

When the linear function is used, because S1 (in the dark state)→S3 (in dark state)=0, and S1 (in the bright state)→S3 (in bright state)=Dmax, $$0=A(x, y)*D(\text{in the dark state})(x, y)+B(x, y)$$

$$D\text{max}=A(x, y)*D(\text{in the bright state})(x, y)+B(x, y)$$

Here, D (in the dark state) (x, y) denotes the value of the image signal S1 in the dark state, and D (in the bright state)(x, y) denotes the value of the image signal S1 in the bright state.

From these equations, A (x, y) and B (x, y) can be found as follows:

$$A(x, y)=D\text{max}/D(\text{in the bright state})(x, y)-D(\text{in the dark state})(x, y))$$

$$B(x, y)=D\text{max}*D(\text{in the dark state})(x, y)/(D(\text{in the dark state})(x, y)-D(\text{in the bright state})(x, y))$$

The offset correction value B (x, y) and gain correction value A (x, y) thus determined for the photoelectric transducers 24 are stored in the correction table 16.

Then, as with the image signal correction device 10, the X-rays 5 emitted from the X-rays source 4 are projected onto the subject 6, penetrating it. The X-rays 5 penetrating the subject 6 are projected onto the detector 1. The X-rays 5 projected onto the detector 1 are projected onto the scintillator 3 to be converted into visible light. The visible light as a result of the conversion is received by each of the photoelectric transducers 24 constituting the detector 1, being photoelectrically converted. At this time, an address signal A is sent to the scanning pulse generator 29 and output amplifiers 25 from the frame memory 15, and the image signal S1 for each line is output.

On the other hand, from the frame memory 15, an address signal A is also sent to the correction table 16, as is the case with the above-described example, and the image signal S1 output for each line from the detector 1 is corrected for the offsets and gains by the correcting means 41. In other words, in the adjusting means 43, the offset correction value B (x, y) and again correction value A (x, y) stored in the correction table 16 are used to prepare a signal transformation table, and in this table, the output image signal S1 for each line from the detector 1 is corrected and an image signal S3 is output.

Here, it is noted that, if the gain correction is made on the basis of the gain correction value A (x, y) determined as described above, the values of the image signals S3, after the correction when radiation having a dose of radiation exceeding that in the bright state is projected onto the detector 1, are all transformed into the image signal S3 after the correction for the maximum value detection pixel until the image signal S1 for the maximum value detection pixel is saturated. As long as the dynamic range for the image signals S1 is sufficient (refer to the later description), and when the image signal S1 for the maximum value detection pixel is saturated, the values of the image signals after the correction for all the pixels simultaneously take the maximum value after the correction. Thus, if the photoelectric transducers 24 have variations in input-output characteristic, the corrected image signals S3 are free from variations (this is also true for S4, D1, and D2).

For example, assume that any one of the saturation values for the image signals is 1000, and for photoelectric transducers "a" and "b" which have image signal values of 800 and 900 in the bright state, respectively, the maximum value of image signal that can be taken after the correction is 1000, and that, in the dark state, the values are 0.

In this example, assuming that the photoelectric transducer "b" is for the maximum value detection pixel, the gain correction is first made so that the values after the correction in the bright state are both 900. In other words, the image signal of the photoelectric transducer "a" is transformed from 800 to 900, and the image signal of the photoelectric transducer "b" is transformed from 900 to 900.

Here, when radiation having a dose of radiation at which either of the image signals output from the photoelectric transducers "a" and "b" is roughly saturated is projected, for example, when radiation having a dose of radiation at which the image signal of the photoelectric transducer "b" provides 990 (1.1 times the value in the bright state), which is just before the saturation value 1000, is projected, the value after the correction of the photoelectric transducer "b" is 990 (1.1 times the value after the correction in the bright state), which is in the vicinity of 1000, the maximum value after the correction. Also, the value of the image signal of the photoelectric transducer "a" is 880 (1.1 times the value in the bright state), and the value after the correction is 990 (1.1 times the value after the correction in the bright state), thus no difference is produced between the values of both image signals after the correction.

Therefore, by using the above-stated correction method in the correcting means 41 for making the gain correction, if the photoelectric transducers 24 have variations in input-output characteristic, the corrected image signals S3 are free from variations, and thus an image having a good quality can be provided.

In the above description, the condition "as long as the dynamic range for the image signals S1 is sufficient" is given because, if prior to the detection signal S1 of the maximum value detection pixel as being saturated, the image signal S1 of some other pixel is saturated, the image signal S3 after the correction of that pixel is saturated with a value under the maximum level after the correction. So, if the above-stated correction is made, the corrected image signals S3 have a variation. It is needless to say that such a problem can be solved by applying the above-described image signal correction device 10 or 30.

With any one of the above-described embodiments of the present invention, the offset correction is made to correct the variations in input output characteristic of the photoelectric transducers 24 when the X-rays 5 are not projected onto the detector 1, i.e., in dark state. However, the present invention does not always require this offset correction, but can achieve the purpose of the present invention simply by making the gain correction. However, it is preferable to perform the offset correction as stated above because, for all the pixels, the signal values ranging from 0 to the maximum one are properly corrected.

Again, with any one of the above-described embodiments of the present invention, the offset correction values and the gain correction values are determined on the basis of the image signals when the radiation solid-state detector is not irradiated with anything, i. e., is in the dark state, and the image signals when the detector is irradiated with radiation having a maximum dose or radiation having a dose of radiation for lower than the saturated level, and stored in the correction table. However, a method may be used which determines the offset correction values and the gain correction values for the detector independently of the present device rather than on the image signal correction device, stores the separately determined correction values in the correction table beforehand, and on the basis of these, corrects the image signals output from the detector.

Further, the portion other than the X-ray source in the above-stated embodiments, specifically, the correcting means according to the present invention can be integrated with the solid-state detector, and preferably also integrated with the logarithmic transforming means 13, the A/D converter 14, and the frame memory 15 to form a solid-state detector having a correction capability.

What is claimed is:

1. A pixel signal correction method for correcting output pixel signals from a solid-state detector which detects visible light or radiation and obtains pixel signals each representing a signal value of a pixel, wherein said correction is made so that the signal value of each pixel is set at a saturation level when light or radiation is projected onto said solid-state detector at a level at which the highest one of the output pixel signals before the correction reaches the saturation level.

2. A pixel signal correction method for correcting output pixel signals from a solid-state detector which detects visible light or radiation and obtains pixel signals each representing a signal value of a pixel, wherein a greatest pixel signal value of the output pixel signals is determined when light or radiation is projected onto said solid-state detector, at a level at which any one of the output pixel signals of said detector before the correction is at a level lower than a saturation level, and said correction is made for each of said output pixel signals so that the signal value of each pixel is set at a value which is equal to or greater than said greatest pixel signal value.

3. A pixel signal correction device which corrects output pixel signals from a solid-state detector which detects visible light or radiation and obtains pixel signals each representing a signal value of a pixel comprising:

an irradiating means which irradiates said solid-state detector with light or radiation; and a correcting means which makes said correction so that the signal value of each pixel is set at a saturation level in the state where the irradiation is provided at a level at which the highest one of said output pixel signals before the correction reaches the saturated level.

4. A pixel signal correction device which corrects output pixel signals from a solid-state detector which detects visible light or radiation and obtains pixel signals each representing a signal value of a pixel comprising:

an irradiating means which irradiates said solid-state detector with light or radiation; and a correcting means which determines a greatest pixel signal value of the output pixel signals in the state where the irradiation is provided at a level at which any one of the output pixel signals before correction is at a level lower than a saturation level, and said correction is made for each of the output pixel signals so that the signal value of each pixel is set at a value which is equal to or greater than said greatest pixel signal value.

5. A pixel signal correction device as defined in claim 3 or 4 wherein said solid-state detector comprises a first electrode layer, a photoconductive recording layer which shows conductivity its recording light, upon exposure photoconductive read-out layer which shows conductivity upon its exposure to reading light, and a second electrode layer provided with a stripe electrode consisting of a number of linear electrodes.

6. A pixel signal correction device as defined in claim 3 or 4 wherein said solid-state detector comprises a first electrode layer provided with a first stripe electrode consisting of a number of linear electrodes, a photoconductive recording layer which shows conductivity upon its exposure to recording light, an electric storing portion for storing electric charges generated in said photoconductive recording layer, a photoconductive pre-exposure layer which shows conductivity upon its exposure to pre-exposure irradiation for uniformly charging said storing portion, and a second electrode layer provided with a second stripe electrode consisting of a number of linear electrodes arranged to cross with said linear electrodes of said first stripe electrode, said layers and portion being disposed in the above order.

7. A pixel signal correction device as defined in claim 3 or 4 wherein said solid-state detector comprises a first electrode provided layer with first stripe electrode consisting of a number of linear electrodes, a photoconductive recording layer which shows conductivity upon its exposure to pre-exposure light and recording light, an electric storing portion storing electric for said charges generated photoconductive recording layer, a dielectric layer, and a second electrode layer provided with a second stripe electrode consisting of a number of linear electrodes arranged to cross with said linear electrodes of said first stripe electrode, said layers and portion being disposed in the above order.

8. A pixel signal correction device as defined in claim 3 or 4 wherein said solid-state detector comprises first electrode layer provided with first stripe electrode consisting of a number of linear electrodes, a photoconductive recording layer which shows conductivity upon its exposure to recording light, an electric storing portion for storing electric charges generated in said photoconductive recording layer, a rectifying layer, and a second electrode layer provided with a second stripe electrode consisting of a number of linear electrodes arranged to cross with said linear electrodes of said first stripe electrode, said layers and portion being disposed in the above order.

9. A solid-state detector which detects visible light or radiation and obtains pixel signals each representing a signal value of a pixel comprising:

a correcting means which corrects output pixel signals from said detector so that the signal value of each pixel is set at a saturation level when light or radiation is projected on said detector at a level at which the highest one of the output pixel signals before the correction reaches the saturation level.

10. A solid-state detector which detects visible light or radiation and obtains pixel signals each representing a signal value of a pixel comprising:

a correcting means which determines a greatest pixel signal value from output pixel signals from said detector when light or radiation is projected on said detector at a level at which any one of the output pixel signals of said detector before the correction is at a level lower than a saturation level, and corrects the output pixel signals from said detector so that the signal value of each pixel is set at a value which is equal to or greater than said greatest pixel signal value.

11. The pixel signal correction method of claim 1, wherein the correction includes an offset correction and a gain correction to the output pixel signal to obtain the signal value of each pixel.

12. The pixel signal correction method of claim 2, wherein the correction includes an offset correction and a gain correction to the output pixel signal to obtain the signal value of each pixel.

13. The pixel signal correction device of claim 3, wherein the correction includes an offset correction and a gain correction to the output pixel signal to obtain the signal value of each pixel.

14. The pixel signal correction device of claim 4, wherein the correction includes an offset correction and a gain correction to the output pixel signal to obtain the signal value of each pixel.

15. The method of claim 1, further comprising log conversion of corrected output pixel signals.

* * * * *